United States Patent [19]

Burgin

[11] Patent Number: 5,051,620
[45] Date of Patent: Sep. 24, 1991

[54] PRECHARGED LOGIC SYSTEMS WITH PROTECTION AGAINST CURRENT LEAKAGE

[76] Inventor: Kenneth N. Burgin, The Pike Lock House, Eastington, Stonehouse, Gloucestershire, United Kingdom

[21] Appl. No.: 560,151

[22] Filed: Jul. 31, 1990

[51] Int. Cl.[5] .................... H03K 19/16; H03K 19/95
[52] U.S. Cl. .................................. 307/452; 307/468; 307/481; 307/263; 307/530
[58] Field of Search ............... 307/443, 448, 451, 465, 307/468, 263, 530, 480, 481

[56] References Cited

U.S. PATENT DOCUMENTS

| 4,709,168 | 11/1987 | Kamuro et al. | 307/263 |
| 4,851,720 | 7/1989 | Pathak et al. | 307/468 |

*Primary Examiner*—Stanley D. Miller
*Assistant Examiner*—Margaret Rose Wambach
*Attorney, Agent, or Firm*—Edward D. Manzo

[57] ABSTRACT

In a CMOS logic circuit an output node is controlled by a plurality of transistors of a first type and precharged by a precharging transistor of a second type. Clock pulses of alternate first and second levels are supplied to the precharging transistor. The first level switches the precharging transistor on to precharge the output node while the second level substantially switches off the precharging transistor but not completely so as to leave a small current flow through the precharging transistor.

13 Claims, 1 Drawing Sheet

PRECHARGED LOGIC SYSTEMS WITH PROTECTION AGAINST CURRENT LEAKAGE

The invention relates to precharged logic systems and particularly to CMOS logic circuits.

BACKGROUND OF THE INVENTION

Many logic circuits including complex logic functions such as decoders or logic gates with large numbers of inputs have been implemented in semiconductor devices including CMOS devices. When such logic systems are implemented in a full CMOS arrangement there has been a requirement for equal numbers of transistors of both P and N type. For this reason precharging techniques have been used in which an output node has been precharged by one or more precharging transistors of a first type and a plurality of inputs are fed to respective transistors of the opposite type and arranged so that the output node may remain charged or discharged depending on the particular input signals in relation to the logic function to be carried out by the circuit. By such precharging techniques it is possible to reduce the number of transistors required by almost one-half.

Simple two-phase clocking systems have been proposed for such precharging circuits such that the output node is precharged high or low during a first phase indicated by a first clock pulse and the value of the output is evaluated in a subsequent phase corresponding to a second clock pulse different from the first. In such arrangements the precharging occurs during a first clock pulse and evaluation of the output during a second clock pulse. Such schemes have been satisfactory provided the clock system remains satisfactory. If however the clock is stopped or a slow clock pulse is provided problems can arise during the second clock pulse or evaluation phase. In this event charge can be lost from the precharged output node due to the clock being stopped or running slow. This can result in an erroneous output from the output node.

It is an object of the present invention to provide a circuit and method of operation in which the benefit of using a reduced number of transistors is maintained while tolerating a period without an expected clock pulse.

It is a further object of the invention to control a precharging transistor in such a logic circuit so that during a phase when the output may be evaluated the precharging transistor is not switched completely off so that the output node is not erroneously discharged through excessive delays between successive clock pulses.

SUMMARY OF THE INVENTION

The invention provides a CMOS logic circuit having (i) first and second voltage supply lines of different voltage levels, (ii) a plurality of logic circuit inputs, (iii) an output node (iv) transistor circuitry comprising a plurality of transistors of a first type, said transistor circuitry being connected between the first said voltage supply line and said output node and said inputs being connected to respective gates of said transistors of a first type, (v) at least one precharging transistor of a second type coupled between said output node and the second of said voltage supply lines, and (vi) clocking circuitry coupled to a gate of the said precharging transistor of said second type and arranged to provide alternately high and low clock pulses to the transistor of a second type, one of said clock pulses being arranged to switch on the said precharging transistor of a second type to precharge the output node and the other of said clock pulses being arranged to reduce current flow through the transistor of the second type, said clocking circuit being arranged to provide said other of the clock pulses with a voltage level between that of said first and second voltage supply lines but different from that of said second voltage supply line whereby the said precharging transistor of the second type is not fully switched off during said other clock pulse.

The invention also provides a method of operating a CMOS logic circuit having a plurality of inputs and an output node in which a plurality of transistors of a first type are connected between the output node and a first voltage supply line and at least one precharging transistor of a second type is connected between the output node and a second voltage supply line of a voltage level different from that of the first voltage supply line, which method comprises supplying to a gate of the said precharging transistor a succession of first and second clock pulses of different voltage levels, said first clock pulses having a voltage level to switch on the precharging transistor to precharge said output node and said second clock pulses having a voltage level to reduce current flow through the said precharging transistor but different from said second voltage supply line so that the or each precharging transistor is not switched fully off during said second clock pulse, applying input signals to said inputs and evaluating an output at said output node during said second clock pulses to determine if said output node is discharged by said transistors of a first type.

Preferably the precharging transistor is coupled to a switched current mirror in said clocking circuit.

Preferably said clocking circuit comprises a first current mirror transistor of said second type connected to said second voltage supply line and connected in series with switching transistors of said first and second type, said switching transistors being connected to receive a succession of alternate clock signals having voltage levels of said first and second voltage supply lines respectively.

Said first current mirror transistor may be coupled to a second current mirror in said clocking circuit, said second current mirror being arranged to determine current flow through said first current mirror transistor.

DESCRIPTION OF THE PREFERRED EMBODIMENT

Figure 1:
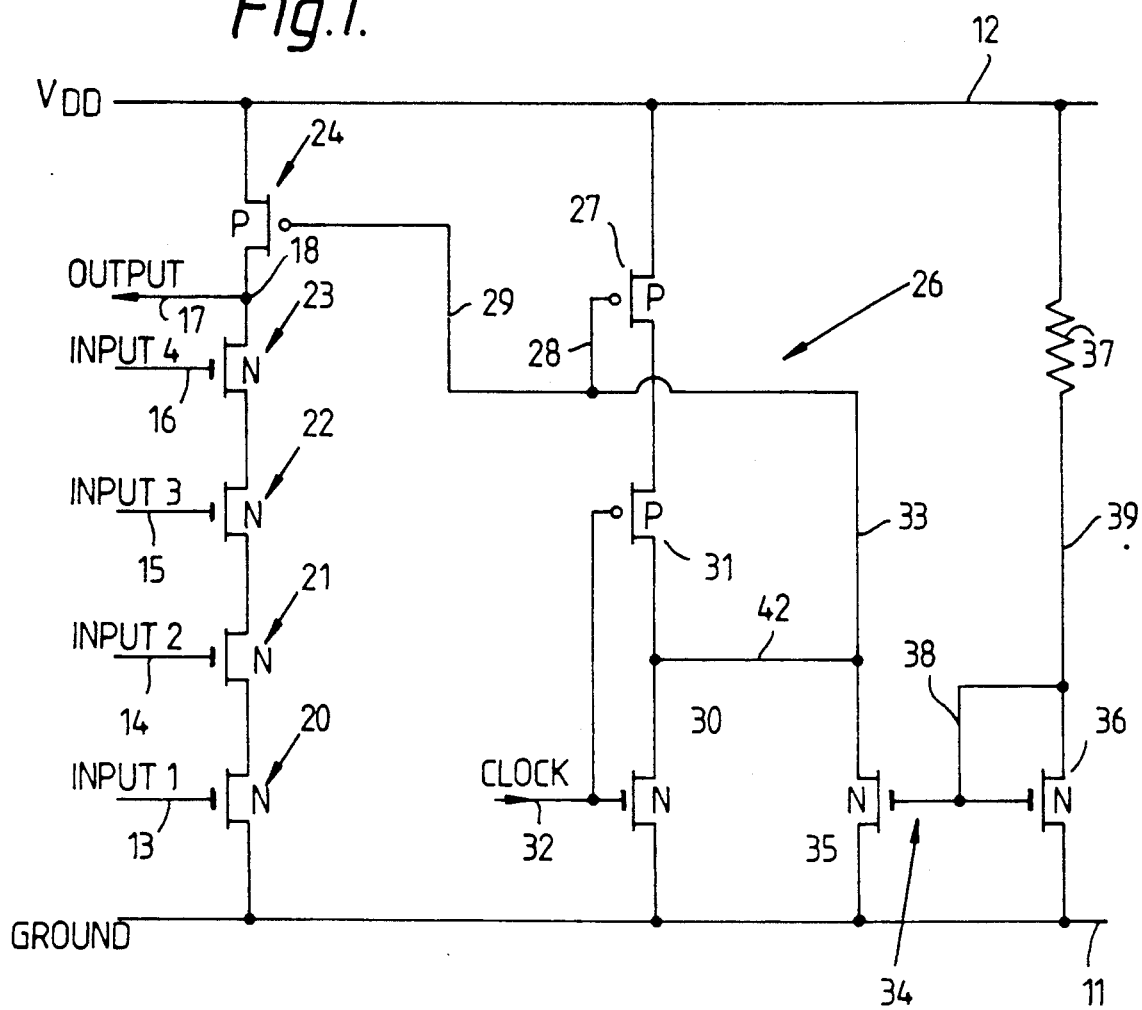
FIG. 1 is a diagram of a logic circuit in accordance with the present invention.

The example shown in FIG. 1 is a CMOS precharge logic circuit in the form of a four input NAND circuit. The circuit has a first voltage supply line 11 which in this example is a ground line and a second voltage supply line 12 set at a supply voltage VDD. Four circuit inputs 13, 14, 15 and 16 are provided as well as an output 17 connected to an output node 18. Transistor circuitry consisting of four series connected transistors 20, 21, 22 and 23 are connected between ground line 11 and the output node 18. The four inputs 13 to 16 are connected to respective gates of the transistors 20 to 23.

The transistors 20 to 23 are all of the same type and in this example are N type. A precharged transistor 24 which in this example is P type is connected between the output node 18 and the second voltage supply line 12. When the transistor 24 is switched on the output node 18 is charged up from the supply line 12 and when it is switched off the output node 18 can be discharged through the transistors 20, 21, 22 and 23.

Operation of the transistor 24 is controlled by a clocking circuit 26. The clocking circuit 26 includes a P type transistor 27 having its gate connected through lines 28 and 29 to the gate of transistor 24 thereby forming a first current mirror. The transistor 27 is connected in series with two switching transistors 30 and 31 which form a series connection with the transistor 27 between the voltage supply lines 11 and 12. Transistor 30 is N type and transistor 31 is P type. A standard clock input 32 is connected to the gates of both the transistors 30 and 31 so that the transistors 30 and 31 are switched on and off alternately with one being off when the other is on and vice versa. The gate of transistor 27 is connected through lines 28 and 33 to a further current mirror 34 consisting of two N type transistors 35 and 36. Transistor 36 is connected in series with a resistor 37 between the voltage supply lines 11 and 12 thereby determining the current flow through the transistor 36. The gates of the two transisors 35 and 36 are connected together and connected through line 38 to line 39 interconnecting transistor 36 with the resistor 37. In this way the current flow through transistor 35 is equal to that flowing through transistor 36. This current flows to the gates of transistors 24 and 27.

Figure 2:
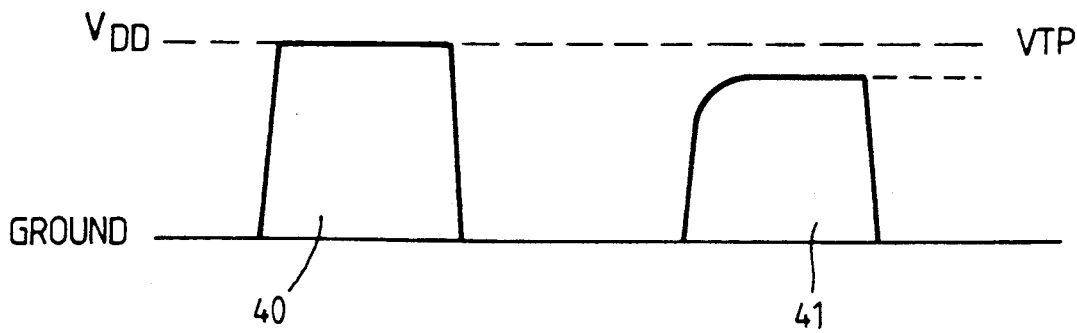
FIG. 2 shows two different types of clock pulse in a sequence of clock pulses.

The operation of the circuit will now be described with further reference to FIG. 2. FIG. 2 shows a succession of clock pulses and two different types of clock pulse are shown in FIG. 2. The first pulse 40 comprises a pulse of voltage VDD followed by a pulse of ground voltage. The second type of pulse illustrated and marked 41 is a pulse reaching a voltage slightly less than VDD followed by a pulse of ground voltage. Pulse 41 has a peak voltage separated from voltage VDD by a voltage VTP which is approximately equal to the threshold of the transistor 27.

A pulse train having pulses of the type marked 40 alternating with ground level pulses represents conventional clock pulses. Such conventional clock pulses may be positive or negative with respect to ground. Negative pulses of this type are supplied at the input 32 to form a conventional clock source. These pulses switch the transistors 30 and 31 on and off alternately as described above. When transistor 31 is off no current can flow through transistor 27. However, when transistor 31 is on and transistor 30 is off current can flow from the current mirror 34 through lines 42 and 28 to the gate of transistor 27. The threshold voltage of transistor 27 does however cause the current flowing through line 29 to be reduced relative to that flowing through transistor 35 so that the voltage applied to the gate of transistor 24 is represented by a peak of the pulse 41 shown in FIG. 2. In other words the voltage applied to the gate of transistor 24 is approximately the threshold voltage VTP of transistor 27 below the voltage VDD. Consequently the supply of conventional clock pulses to the input 32 result in the supply of clock pulses of the type shown at 41 on line 29, rather than conventional clock pulses of the type shown at 40.

In operation therefore a succession of pulses of the type shown at 41 in FIG. 2 separated by pulses of ground level are supplied to the transistor 24. While the clock pulses have ground level the transistor 24 is switched on so that the output node 18 is charged up. The duration of each clock pulse 41 forms an evaluate phase when the current through the transistor 24 is reduced but it is not switched off fully. In this way a small amount of bleed current is passed through the transistor 24 during the evaluate phase and offset any very low leakage through the reverse biased P-N junctions and any other MOS structures in the circuitry. This maintains the output node 18 in its precharged condition so that the output 17 obtained during any evaluate operation is a proper reflection of the input values on the inputs 13 to 16 and is not erroneous due to stopping of the clock or any slowness of the clock. The output node 18 will only discharge if the input conditions require it to be discharged.

The difference in voltage between the pulse 41 and VDD is preferably close to the threshold voltages of the transistors used. The sub-threshold region of the precharged transistor is likely to be sufficient to counter any threshold mismatching which might otherwise cause some transistors to be switched off.

It will be appreciated that although the above example illustrates a simple four input NAND circuit the invention may be applied to any CMOS logic circuit which may include any number of inputs in the transistor circuitry used to discharge the output node. More than one precharging transistor may be used to precharge the output node or nodes. The type of transistors used for charging and discharging the output node may of course be reversed from that shown in this example. In this way the technique can be applied to N logic precharge high circuits or P logic precharge low circuits.

I claim:

1. A method of operating a CMOS logic circuit in which an output node is controlled by a plurality of transistors of a first type forming a logic array and precharged by a precharging transistor of a second type, said method including supplying a sequence of clock pulses of alternate first and second levels to said precharging transistor, clock pulses of said first level switching on the precharging transistor to precharge the output node and clock pulses of said second type substantially reducing current flow through the precharging transistor without switching off fully the precharging transistor, whereby precharge obtained during one clock pulse of said first level is not leaked away in the event of delay in receiving a next clock pulse of said first level.

2. The method of claim 1 wherein said clock pulses comprise first clock pulses and wherein the step of supplying first clock pulses to the precharging transistor includes:

receiving a sequence of second clock pulses alternating between a supply voltage and a reference voltage;

generating the first clock pulses from said second clock pulses, said first pulses alternating between the reference voltage and another voltage level having less amplitude than said supply voltage.

3. The method of claim 2 wherein said generating step includes configuring the precharging transistor in a first current mirror, configuring a second current mirror, receiving said second clock pulses at gate electrodes of a pair of complementary transistors in such fashion that one of the complementary transistors turns on and the other turns off depending on the voltage level of the second clock pulses, and applying voltages from the complementary pair of transistors to said first and said second current mirrors to provide said first clock signals from said first current mirror.

4. The method of claim 2 wherein the maximum amplitude of said first clock pulses is substantially one threshold voltage below the maximum amplitude of said second clock pulses.

5. A CMOS logic circuit having:
(i) first and second voltage supply lines of different voltage levels,
(ii) a plurality of logic circuit inputs,
(iii) an output node,
(iv) transistor circuitry comprising a plurality of transistors of a first type, said transistor circuitry being connected between said first voltage supply line and said output node, said logic circuit inputs being connected to respective gate electrodes of said transistors of a first type,
(v) at least one precharging transistor of a second type coupled between said output node and said second voltage supply line, and
(vi) clocking circuitry coupled to a gate electrode of said precharging transistor of said second type and arranged to provide a sequence of pulses of alternate first and second levels to the said precharging transistor of a second type, clock pulses of said first level being arranged to switch on the said precharging transistor of a second type to precharge the output node and clock pulses of second level being arranged to reduce current flow through the said precharging transistor of the second type, said clocking circuit being arranged to provide said clock pulses of said second level with a voltage level between that of said first and second voltage supply lines but different from that of said second voltage supply line whereby the said precharging transistor of the second type is not fully switched off during said clock pulse of said second level, preventing leaking away of precharge obtained during one clock pulse of said first level in the event of delay in receiving a neck clock pulse of said first level.

6. A CMOS logic circuit according to claim 5 in which said transistor circuitry comprises a multiple input NAND gate.

7. A CMOS logic circuit according to claim 5, in which said precharging transistor is coupled to a switched current mirror in said clocking circuit.

8. A CMOS logic circuit according to claim 7, in which said clocking circuit comprises a first current mirror transistor of said second type connected to said second voltage supply line and connected in series with switching transistors of said first and second type, said switching transistors being connected to receive a succession of alternate clock signals having voltage levels of said first and second voltage supply lines respectively.

9. A CMOS logic circuit according to claim 8 in which said first current mirror transistor is coupled to a second current mirror in said clocking circuit, said second current mirror being arranged to determine current flow through said first current mirror transistor.

10. A CMOS logic circuit according to claim 7 in which said first current mirror transistor is coupled to a second current mirror in said clocking circuit, said second current mirror being arranged to determine current flow through said first current mirror transistor.

11. A method of operating a CMOS logic circuit having a plurality of inputs and an output node in which a plurality of transistors of a first type are connected between the output node and a first voltage supply line and at least one precharging transistor of a second type is connected between the output node and a second voltage supply line of a voltage level different from that of the first voltage supply line, which method comprises
supplying to a gate of the said precharging transistor a succession of first and second clock pulses of different voltage levels,
said first clock pulses having a voltage level to switch on said each precharging transistor to precharge said output node,
said second clock pulses having a voltage level to reduce current flow through said precharging transistor but different from said second voltage supply line so that said precharging transistor is not switched fully off during said second clock pulse, thereby maintaining the precharge obtained during one of said first clock pulse in the event of delay in receiving a further first clock pulse,
applying input signals to said inputs, and
evaluating an output at said output node during said second clock pulses to determine if said output node is discharged by said transistors of a first type.

12. A method according to claim 11 wherein said first and second clock pulses are generated by operation of a switched current mirror circuit.

13. A method according to claim 12 in which a further current mirror circuit is operated to determine a current connected to said switched current mirror circuit.

* * * * *